(12) United States Patent
Messier

(10) Patent No.: US 8,193,956 B2
(45) Date of Patent: Jun. 5, 2012

(54) METER AND FREEZE OF CALIBRATION OF TIME-INTERLEAVED ANALOG TO DIGITAL CONVERTER

(75) Inventor: Jason A. Messier, Medford, MA (US)

(73) Assignee: Intersil Americas Inc., Milpitas, CA (US)

( * ) Notice: Subject to any disclaimer, the term of this patent is extended or adjusted under 35 U.S.C. 154(b) by 162 days.

(21) Appl. No.: 12/768,377

(22) Filed: Apr. 27, 2010

(65) Prior Publication Data

US 2011/0001644 A1  Jan. 6, 2011

Related U.S. Application Data

(60) Provisional application No. 61/222,381, filed on Jul. 1, 2009, provisional application No. 61/222,377, filed on Jul. 1, 2009.

(51) Int. Cl.
*H03M 1/10* (2006.01)

(52) U.S. Cl. ........................... 341/118; 341/155

(58) Field of Classification Search .................. 341/118, 341/120, 155

See application file for complete search history.

(56) References Cited

U.S. PATENT DOCUMENTS

| | | | |
|---|---|---|---|
| 4,965,867 A * | 10/1990 | Tsuchida et al. | 341/118 |
| 5,239,299 A | 8/1993 | Apple et al. | |
| 6,225,928 B1 * | 5/2001 | Green | 341/143 |
| 6,900,750 B1 * | 5/2005 | Nairn | 341/118 |
| 6,999,012 B2 * | 2/2006 | Kim et al. | 341/119 |
| 7,250,885 B1 | 7/2007 | Nairn | |
| 7,253,762 B2 | 8/2007 | Huang et al. | |
| 7,292,170 B2 | 11/2007 | Kinyua et al. | |
| 7,312,734 B2 | 12/2007 | McNeill et al. | |
| 7,330,140 B2 * | 2/2008 | Balakrishnan et al. | 341/118 |
| 7,408,495 B2 | 8/2008 | Stein et al. | |
| 7,482,956 B2 | 1/2009 | Huang et al. | |
| 7,525,462 B2 | 4/2009 | Parthasarthy et al. | |
| 7,541,952 B1 | 6/2009 | Sankaran et al. | |
| 7,675,441 B2 | 3/2010 | Sheng et al. | |
| 7,808,408 B2 | 10/2010 | Madisetti et al. | |
| 2009/0021412 A1 | 1/2009 | Gustafsson | |
| 2010/0049483 A1 | 2/2010 | Johansson et al. | |
| 2011/0063149 A1 * | 3/2011 | Kidambi | 341/118 |

* cited by examiner

*Primary Examiner* — Howard Williams
(74) *Attorney, Agent, or Firm* — Hamilton, Brook, Smith & Reynolds, P.C.

(57) ABSTRACT

A technique for improving the operation of a Time Interleaved Analog to Digital Converter (TIADC) by suppressing updates and/or correction to updates of an interleave mismatch errors estimator when one or more predetermined conditions indicate such mismatch correction may not improve performance.

25 Claims, 4 Drawing Sheets

METER AND FREEZE OF CALIBRATION OF TIME-INTERLEAVED ANALOG TO DIGITAL CONVERTER

CROSS-REFERENCE TO RELATED APPLICATIONS

This application claims the benefit of U.S. Provisional Patent Application Ser. No. 61/222,381 entitled "Meter and Freeze of Calibration of Time-Interleaved Analog to Digital Converter" filed on Jul. 1, 2009 and given U.S. Provisional Patent Application Ser. No. 61/222,377, filed Jul. 1, 2009, and entitled "Randomization of Sample Window in Calibration of Time Interleaved Analog to Digital Converter," and U.S. patent application Ser. No. 12/749,822, filed Mar. 30, 2010 entitled "Randomization of Sample Window in Calibration of Time Interleaved Analog to Digital Converter," the entire contents of each of which are hereby incorporated by reference.

BACKGROUND OF THE INVENTION

Time-interleaved Analog-to-Digital Converters (TIADCs) have received considerable attention in the recent past for applications that require very high sample rates, i.e., sample rates that cannot be provided by a single Analog to Digital Converter (ADC). In a TIADC system, a faster ADC is obtained by combining two or more slower ADCs operating in parallel. Ideally, the slower ADCs should each have the same offset, the same gain, and the same uniform sample instants. In practice, however, due to fabrication errors, component mismatches, temperature variations, mechanical strain, environmental perturbations, etc., this requirement is difficult to achieve. The resulting errors degrade the performance of the TIADC system, thus making the estimation and correction of these errors imperative to improve performance.

Various TIADC interleave error correction techniques are known.

For example, U.S. Pat. No. 7,525,462 describes techniques for gain control in an interleaved analog-to-digital converter that specifically is for performing dispersion compensation on an electromagnetic signal. A coarse programmable gain amplifier (PGA) controller is configured to characterize the output digital signal of each of the analog-to-digital converters and to output a coarse gain control signal based thereon. A coarse programmable gain amplifier receives the coarse gain control signal and amplifies the input analog signal based thereon and outputs an amplified signal. A splitter is configured to divide the amplified signal into a plurality of amplified signals; and a fine PGA controller is configured to determine a fine gain adjustment for each of the plurality of interleaved analog-to-digital converters. A plurality of fine programmable gain amplifiers are provided, each corresponding to one of the plurality of interleaved analog-to-digital converters, and each configured to receive one of the plurality of amplified signals and a fine gain control signal and output an individually-amplified signal to a corresponding one of the interleaved analog-to-digital converters.

U.S. Patent Publication 2009/0021412 describes a method for operating a time-interleaved analog-to-digital converter that comprises an array of M sub ADCs ($ADC_1, ADC_2, \ldots, ADC_M$), where M is an even integer, and each row of the array comprises one of the M sub ADCs. For every sampling instant n, where n is an integer in a sequence of integers, the converter converts the analog input by means of the sub ADC in selected row k(n) of the array, wherein the specific sub ADC is selected according to an algorithm that changes according to a sample index number.

SUMMARY OF THE INVENTION

The present disclosure is directed to a method and apparatus that controls when a TIADC interleave correction algorithm is allowed to operate.

In particular, the analog signal input to the TIADC is monitored ("metered") for one or more predetermined conditions When such predetermined conditions indicate that an interleave error correction scheme will not improve overall system performance, updates to one or more interleave corrections are suppressed (or "frozen").

The monitored predetermined conditions may include
 signal content that alias near certain fractions of the sample rate frequency (such as sample rate over four for a two-channel TIADC)
 limited input power;
 insufficient change in input signal over time; or
 other predetermined input signal conditions.

In certain embodiments, the mismatch suppression can include suppressing updates of mismatch correction estimates that were made prior to detection of the condition. The prior estimates can be stored in a memory for later use.

In certain optional embodiments, the predetermined condition is detecting signal energy near a predetermined frequency related to the sample rate, and the system suppresses updates to sample time or gain corrections.

In other optional embodiments, the predetermined condition is detecting low input signal power, and the system suppresses updates to a gain correction.

In still other embodiments, the predetermined condition is detecting low input signal power, and the system suppresses more than one type of interleave mismatch correction.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF PREFERRED EMBODIMENTS

A description of example embodiments of the invention follows, specifically implemented for a multi-channel time-interleaved analog-to-digital converter (TIADC). Signal processing elements in the TIADC can detect and correct for mismatch errors between two or more ADC cores such as (1) offset error, (2) gain error, (3) sample time error; and/or (4) other types of errors. According to the teachings herein, these signal processing elements specifically meter input signal conditions and control whether the system attempts to update corrections to mismatch errors when certain predetermined input signal conditions are detected.

It should be understood that the signal processing elements described herein may be embodied as discrete analog or digital circuits, as program code executing in a programmable digital processor, a combination of one or more of the same, or in other ways.

Figure 1:
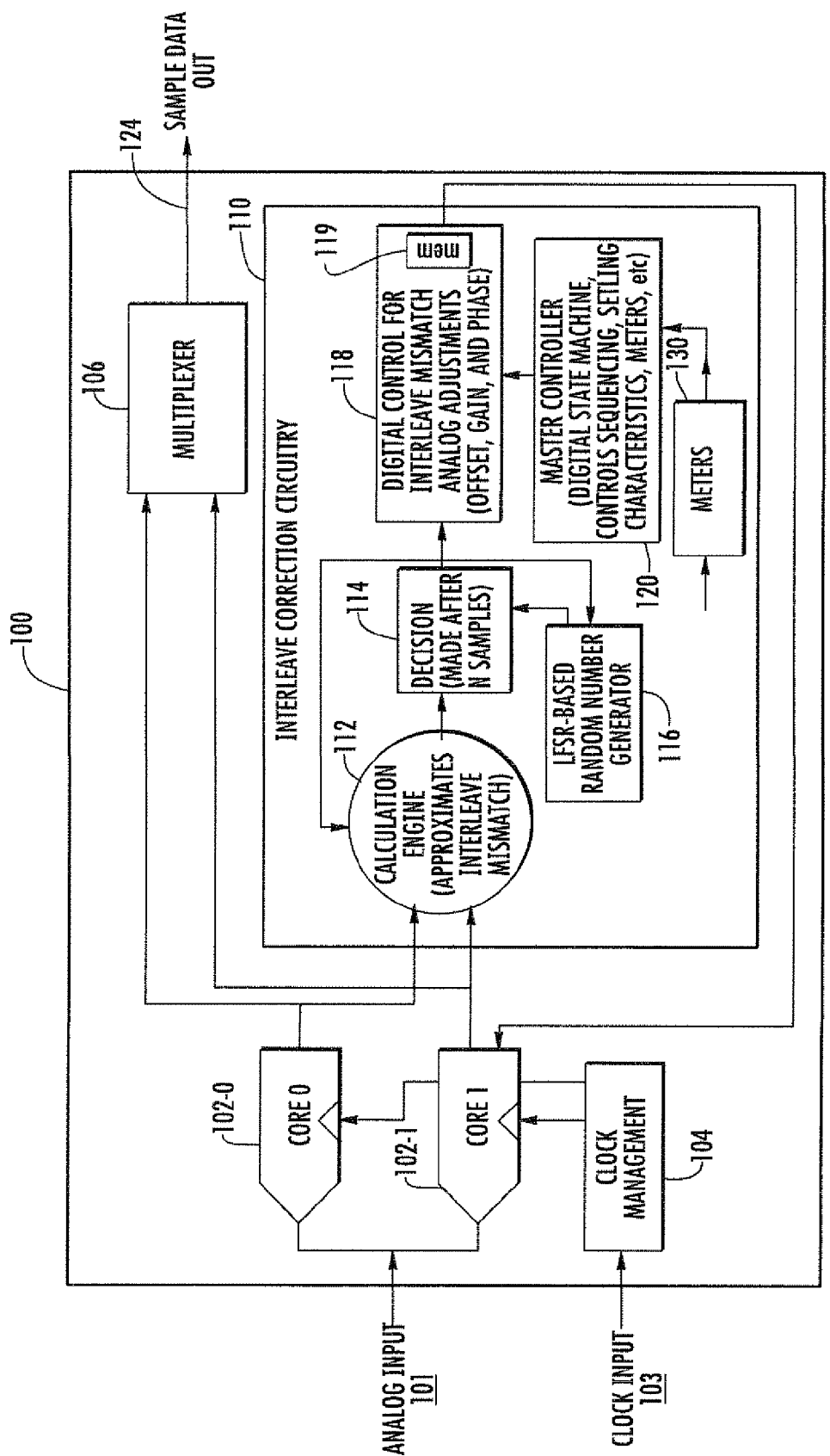
FIG. 1 is a block diagram of a two-channel time-interleaved analog-to-digital converter (TIADC) to which meter and freeze is applied.

Turning attention now to FIG. 1, a TIADC 100 in one embodiment includes two ADC cores 102-0, 102-1, a clock management circuit 104, a multiplexer 106, and interleave correction circuitry 110. The cores 102 are controlled by the clock management circuit 104 to take samples of the analog input 101 at interleaved points in time. In the illustrated embodiment, each core 102 may be running at 250 Mega-Samples Per Second (MSPS) and provide 12 bits of resolution. Also, while a two-channel TIADC is illustrated, it should be understood that the techniques described herein can be generalized to a TIADC system 100 having M cores, where M is typically a factor of two.

Each of the cores 102 may be a charge-domain, successive approximation pipelined ADCs such as those described in U.S. patent application Ser. No. 12/074,706 and U.S. Pat. No. 7,079,067, each of which are also incorporated herein by reference in their entirety. Briefly, in such ADC cores 102, first and second pipeline stages incorporate charge-redistribution, charge-comparison, and charge-redistribution-driver circuits to provide multiple bits of analog-to-digital conversion at high sample rates.

The outputs of the two individual cores 102-0, 102-1 are then combined by multiplexer 106 to result in the digital sampled data output signal 124.

The interleave correction circuitry 110 analyzes the characteristics of the two ADC core 102 outputs, generating real time updated estimates of the mismatch between them. The result of these mismatch calculations can be used to update fine-granularity adjustments for offset, gain, and sample time mismatch. In certain embodiments, these updates are used directly, or in other embodiments can be accumulated over a window having a length equal to some random number, N, of ADC output samples.

In the example of FIG. 1, the core 1 ADC 102-1 is adjusted to match the core 0 ADC's 102-0 offset, gain, and sample time. However, it is also possible to adjust the core 0 ADC 102-0 to match core 1 ADC 102-1, the adjusted core being selectable, or to allow both cores 102 to be adjusted in alternating fashion thereby doubling the available adjustment range.

Interleave correction circuitry 110 includes a calculation engine 112, a decision block 114, a random number generator 116, a digital controller for interleave mismatch (analog adjustments) 118, a master controller 120, and optional analog input meter(s) 130. In general, the calculation engine 112 approximates the mismatch between the interleaved cores 102. The mismatch approximation may be made for one or more of offset, gain, sample time, or other mismatches between the two cores 102.

If utilized, the random number generator 116 may include a linear feedback shift register based random number generator. That random based number is then used as the window size, N, over which to operate the decision block 114. In particular, decision block 114 first accumulates a number of ADC samples, N, output by the calculation engine 112. This result, now accumulated over the random window size N, is then fed to a digital control block 118.

Digital control block 118 then implements the adjustments to offset, gain and phase. In one embodiment, the adjustments for offset, gain, and phase are made independently and sequentially by digital control block 118. For example, during a first time frame, an offset mismatch is calculated and corrected. During a next time frame, for example, the gain offset is estimated and corrected. And finally, during the third time frame, a phase offset is estimated and corrected.

However, in another embodiment, these various adjustments are determined in parallel.

The digital control 118 preferably includes one or more memories 119 to store the state of the corrections to be made. For example, there may be memories for storing the present amounts of adjustments to be made for offset, gain, and/or phase.

It should be understood that the particular mismatches corrected, and the particular corrections implemented, are not particularly germane to the core concept herein of allowing the corrections to operate over a randomized sample window. However, in one preferred embodiment, an adaptive algorithm for the calculation engine 112 is used to correct offset, gain and phase mismatch errors in a two-channel TIADC. This adaptive approach treats each type of error as independent of the others. In one implementation, the adaptation can be a mixed-signal process wherein the estimation of the various errors is carried out in the digital domain while the correction is carried out in the analog domain. As one example, offset can be estimated by assuming that the average offset value of the two ADCs 102 produces a tone at DC while the difference in the offset produces a tone at a Nyquist frequency. The correction then minimizes the tone at Nyquist which depends upon the difference in the offset between the two ADCs 102. This is achieved by making the offset on one of the ADCs equal to that of the other. For gain error estimation and correction, it can be assumed that the difference in gain between the two ADCs 102 produces an image tone reflected around the Nyquist frequency. Phase error can be assumed to produce an image tone reflected around the Nyquist frequency which is $\pi/2$ out of phase with the tone produced by the gain error. Consequently, an adaptive algorithm is used to minimize the differences in auto-correlation between two adjacent pairs of time samples.

More details for how to implement one such blind and background technique for the calculation engine 112 to determine offset, gain, and phase mismatch between the two ADCs 102 is described in a co-pending U.S. patent application Ser. No. 12/419,599 filed Apr. 7, 2009 entitled "Error Estimation and Correction In A Two-Channel Time-Interleaved Analog-to-Digital Converter", the entire contents of which are hereby incorporated by reference. That same patent application also describes details of one way to implement digital control 118 for mismatch correction.

The master controller 120 is a digital finite state machine that handles sequencing, settling characteristics and meter controls for the various elements of the interleave mismatch correction circuitry 110.

Aspects of the present disclosure are specifically directed to analyzing the input signals before a decision is made to implement adjustments for interleave mismatch.

For example, an input 101 that has significant frequency content close to the sample clock frequency divided by four (for a two channel TIADC system such as that shown in FIG. 1) is, by definition, well correlated with the sample clock 103 itself. This correlation of input 101 to sample clock 103 will cause the mismatch calculations to produce inaccurate results, dominated by the analog input signal itself rather than the interleave mismatch errors (and subsequently causing very poor interleave performance). Other conditions, such as low input signal power or insufficient change in signal content can also degrade performance of the correction circuitry 110.

Detecting such adverse conditions and suppressing correction improves the general applicability of the referred background calibration (and perhaps many other) interleave algorithms.

More particularly, meters 130 measure the input signal(s) for characteristics that can obscure such interleave artifacts and thus reduce the effectiveness of the interleave correction 110. When meters 130 indicate such a condition, they output signals to master controller 120 which in turn causes digital control 118 to stop any changes in its interleave mismatch adjustment—that is, to "freeze" where it is. In this state the digital control may, for example, continue to use the last best known information stored in memory 119, to continue the interleave correction process. In this embodiment, further updates to the mismatch correction are suppressed as long as the condition exists. Once the condition is no longer detected, updates are again enabled.

In other embodiments, interleave correction may be disabled entirely whenever meters 130 indicate the predetermined conditions are present.

The meters 130 may detect if the predetermined condition(s) exist by analyzing the analog input 101 directly (in the analog domain) and/or may operate on the outputs of ADC cores 102 (in the digital domain).

The input signal characteristics which the meters 130 may detect can include:
low or nonexistent input analog input power;
insufficient dV/dt for sample time measurement; or
a large percent of analog input total energy at a frequency that aliases close to a selected fraction of the sample rate (for example, in the case of a two-channel TIADC, these predetermined frequencies are N*Fs/4; in the case of a four-channel TIADC, these frequencies are N*Fs/8, etc., where Fs is the sample rate, and N is an integer).

More particularly, a low analog input power condition might be detected by a meter 130 that detects signal power. In this instance, a decision may be made to shut off any further changes to the gain correction or even shut off all corrections, if the measured input signal power drops below a predetermined threshold.

An insufficient dV/dt condition can be detected by another meter 130 that detects a rate of change in the input signal. If a minimum change over time condition is not detected, this output is then used by digital control 118 to freeze any update of a phase correction.

A condition indicating that a large percentage of input energy is near a critical fraction of the sample rate frequency can be detected by yet another meter 130 (e.g., N*Fs/4 for a two-channel TIADC). In one implementation, the meter can be a bandpass filter that detects signal energy at one or more critical frequencies. If the detected signal energy exceeds a threshold amount, then the controller can shut off or freeze both gain and sample time measurement corrections.

With the use of various input signal meters 130, a "clean use" model of the interleave correction circuitry 110 can be provided. The result is that the TIADC system 100 that has interleave mismatch correction features will not perform any worse than a previous product that does not include any interleave-corrected circuitry whatsoever. This can be helpful in obtaining adoption of newer interleave mismatch correction technology in legacy applications.

Figure 2A:
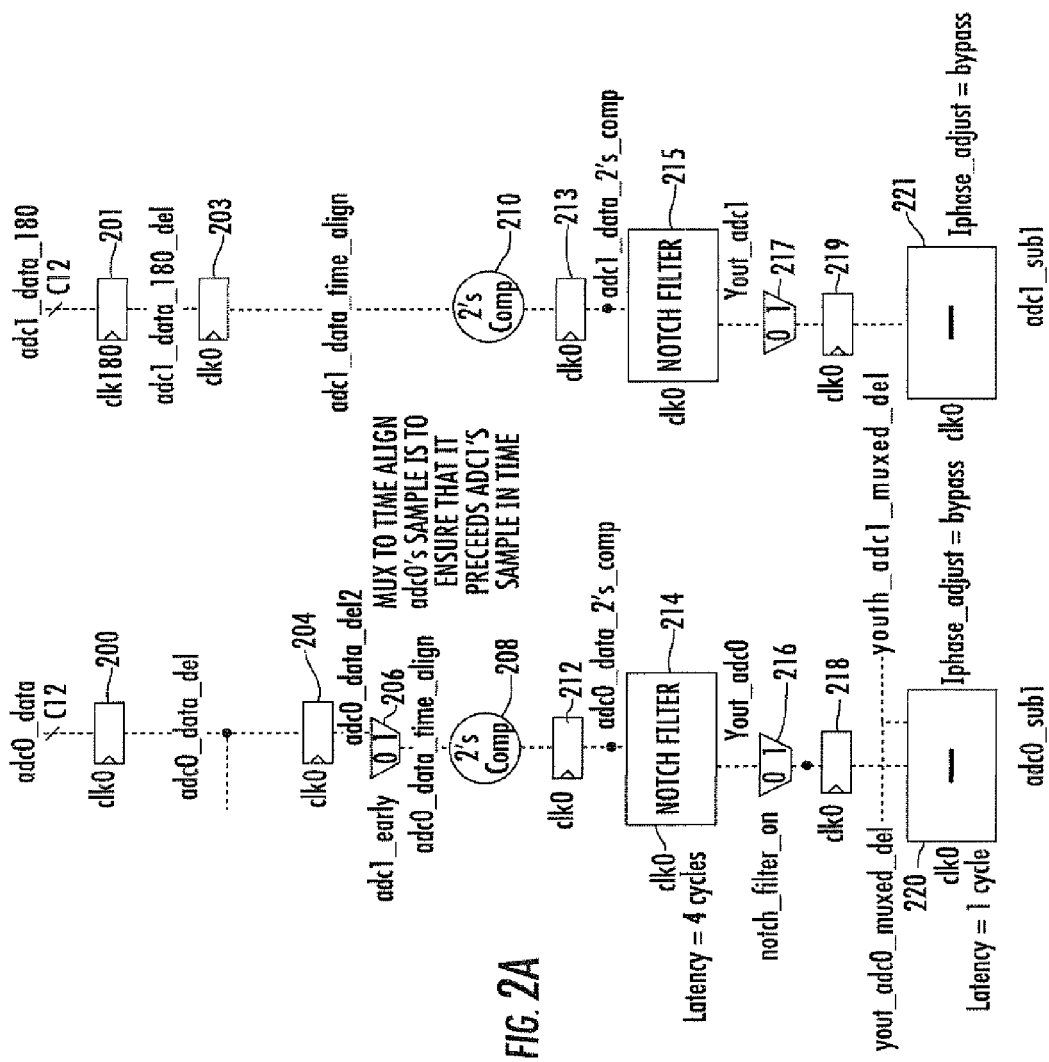
FIGS. 2A and 2B are a more detailed flow diagram of an implementation.
Figure 2B:
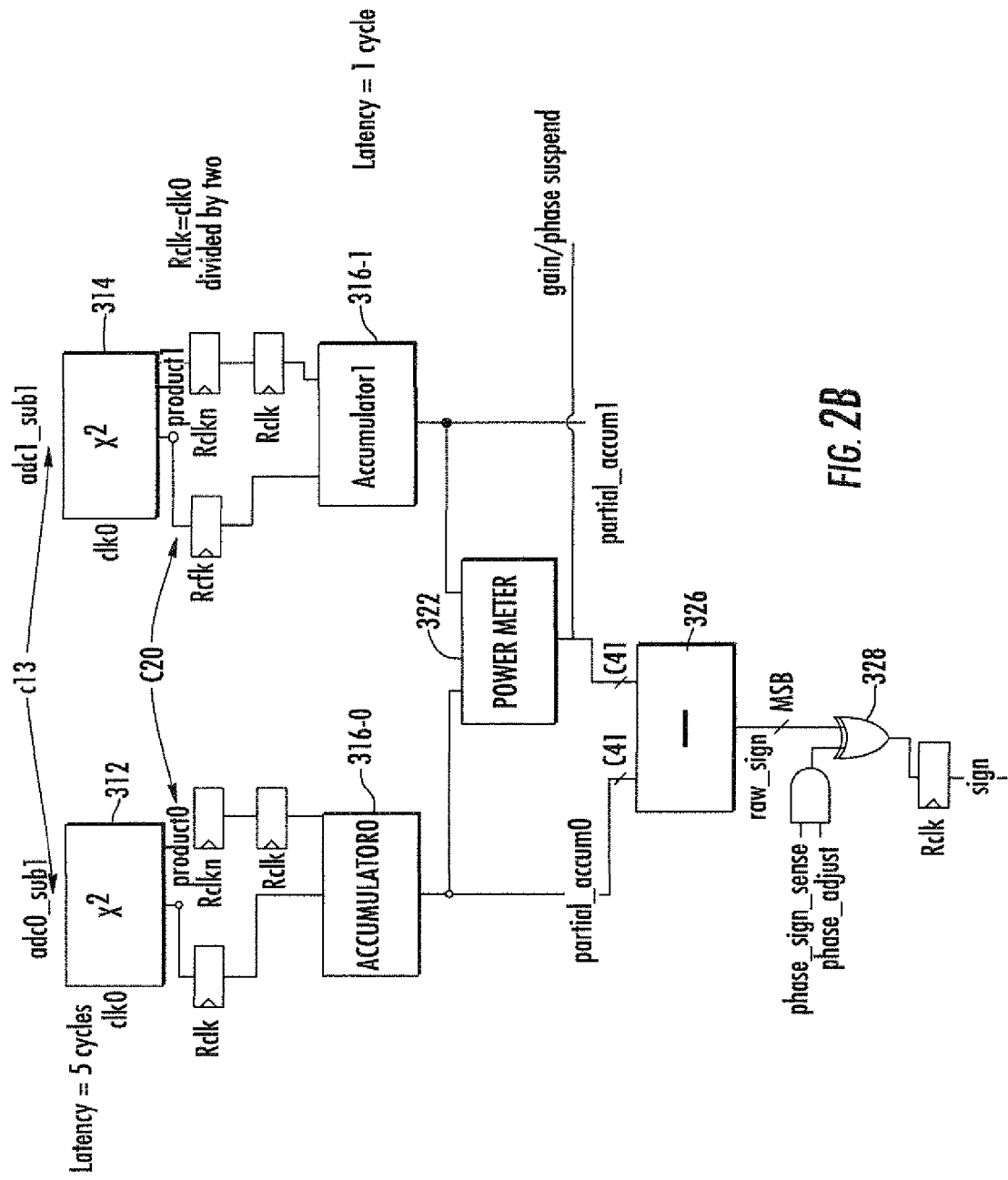

FIGS. 2A and 2B are a more detailed circuit level implementation of portions of the interleave correction circuitry 110. This example implements interleave correction to the analog signals. In FIG. 2A, the first few register blocks 200, 201, 202, 203, receive samples from the respective ADC cores 102-0 and 102-1 (respectively shown on the left and right signal flow paths) and performs time-alignment. Multiplexer 206 is then used to ensure that the samples from ADC 0 always precede the samples from ADC 1 in time.

Notch filters 214, 215 are then used to remove sample signal artifacts close to the predetermined frequency (e.g., Fs/four for a two-channel TIADC (or other frequencies that are well correlated with the sample clock to otherwise cause aliasing). These filters can be switched on or off by multiplexers 216, 217 depending upon the desired effect.

The correction function then implements phase adjustment via blocks 220, 221, and offset adjustment via squaring blocks 312, 314.

Accumulators 316-0, 316-1, 316-2 and 316-3 then accumulate the N samples over which the interleave correction is implemented.

A power meter 322 measures signal power in the two paths and outputs a signal that can be used to suspend gain and phase correction.

Blocks 326 and 328 then provide phase correction. A final output indicates the adjustment at logic gate 328.

FIGS. 2A and 2B also illustrates one example of how the various meter 130 outputs of FIG. 1 are used to control the digital control block 118 in more detail.

In particular, when a meter indicates that a phase correction should be disabled, inputs are provided to disable blocks 312 and 314.

When a meter 130 indicates that a gain correction should be suspended, inputs are provided to disable power meter block 322.

Figure 3:
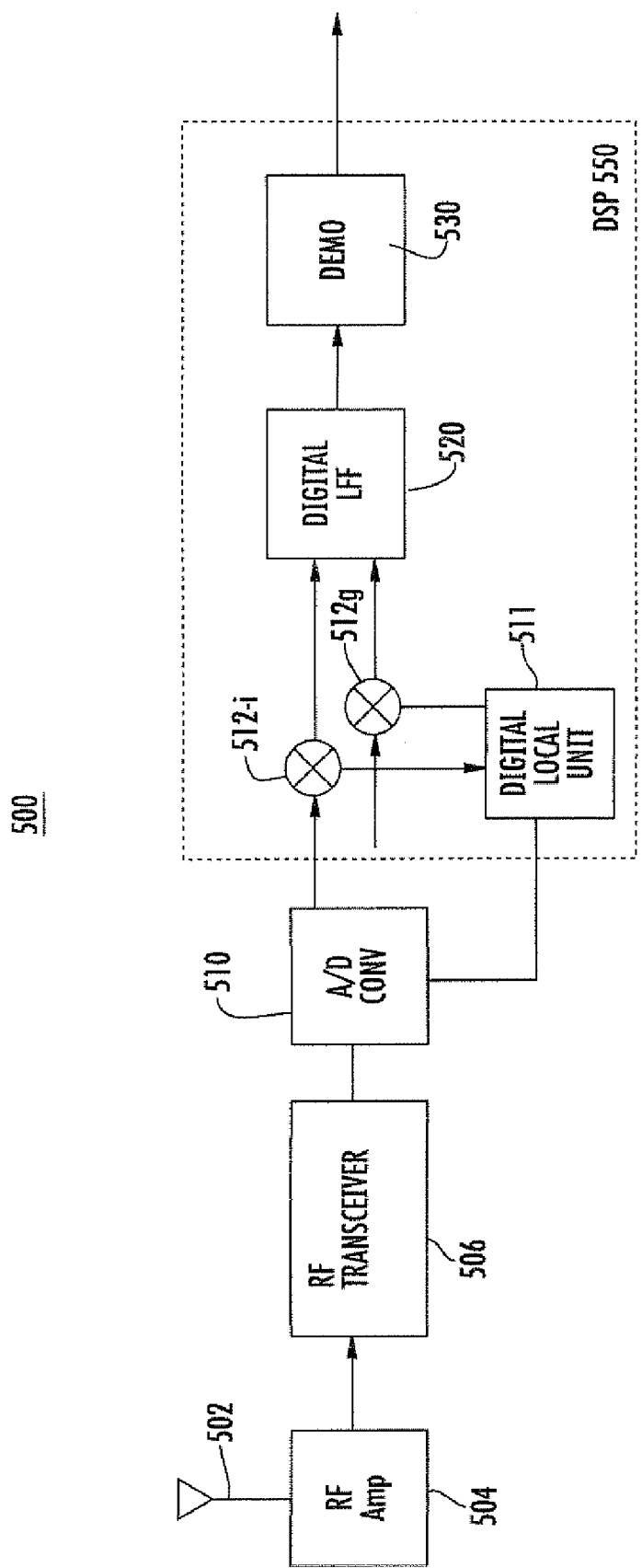
FIG. 3 is a high level diagram of a digital radio receiver that uses the TIADC of FIG. 1.

One particular use of the ADC of FIG. 1 is to implement a digital radio receiver as generally shown in FIG. 3. A Radio Frequency (RF) signal is received at a radio frequency RF amplifier 504. The RF signal may have originated from an antenna 502, such as in a wireless application, or may have been provided via a wire or optic fiber, such as may be in a cable modem or other wired communication signal interface. The amplified RF signal is then fed to an RF translator 506 to down-convert the amplified RF signal to an intermediate frequency (IF). After the RF translator 506 (which may be optional) the ADC 510 is then used to digitize the IF input into digital samples for subsequent processing. A digital local oscillator 511 may operate digital mixers 512-$i$ and 512-$q$ to provide in-phase and quadrature samples thereof. A digital low pass filter 520 limits the frequency content of resulting signal to the desired bandwidth. A demodulator 530 then recovers the original modulated signal. One or more of the operations of the digital local oscillator 511, mixers 512, low pass filter 520 and/or demodulator 530 may be implemented in a digital signal processor 550. The recovered signal may then be further processed, e.g., converted back to an analog baseband signal or the like, depending on the specific end application of the digital receiver.

While this invention has been particularly shown and described with references to example embodiments thereof, it will be understood by those skilled in the art that various changes in form and details may be made therein without departing from the scope of the invention encompassed by the appended claims.

What is claimed is:

1. A method for operating a time-interleaved analog to digital converter (ADC) comprising:
    sampling an input signal with at least a first and second ADC core at alternating sample time intervals to produce at least a first and a second digital signal;
    estimating at least one mismatch error from samples of the first and second digital signals;

generating a correction signal based on the at least one mismatch error;
detecting a predetermined condition in the input signal; and
if the predetermined condition in the input signal is detected, then suppressing mismatch correction of the ADC.

2. The method of claim 1 wherein the step of suppressing mismatch correction suppresses an update of the mismatch correction.

3. The method of claim 1 wherein the step of generating a correction signal stores at least one estimate result of the mismatch correction.

4. The method of claim 3 wherein the step of suppressing mismatch correction of the operation of the ADC further comprises:
using a stored estimate result of a prior step of generating a mismatch correction signal; and
continuing to correct the operation of the ADC using the stored estimate result until the predetermined condition in the input signal is no longer detected.

5. The method of claim 1 wherein the predetermined condition comprises detecting signal energy that aliases near a predetermined fraction of a sample rate frequency, and the selectively controlling step further comprises suppressing updates to correction of at least one of a sample time or a gain.

6. The method of claim 5 wherein the step of detecting signal energy is performed by bandpass filtering the input signal.

7. The method of claim 1 wherein the predetermined condition comprises detecting low input signal power and the suppressing mismatch correction step further comprises suppressing updates to a gain correction.

8. The method of claim 1 wherein the predetermined condition comprises detecting low input signal power and the suppressing mismatch correction step further comprises suppressing more than one mismatch correction.

9. The method of claim 1 wherein the predetermined condition is an insufficient rate of change over time in the input signal, and the suppressing mismatch correction step further comprises suppress update of a phase correction.

10. The method of claim 1 further comprising:
interleaving the first and second digital signals with a multiplexer to form a digital representation of the input signal.

11. The method of claim 1 wherein the mismatch error is at least one of offset, gain, or sample-time error.

12. The method of claim 1 wherein the step of estimating further comprises: estimating at least two different mismatch errors.

13. The method of claim 1 wherein the analog to digital converter is part of a digital radio frequency signal receiver.

14. An analog to digital converter apparatus comprising:
a first analog to digital converter core connected to receive an analog input signal and to output a first converted digital signal;
a second analog to digital converter core connected to receive the analog input signal and to output a second converted digital signal;
an interleave error estimator, for estimating at least one interleave mismatch error between the first and second converted digital signals, to produce an interleave error estimate;
a meter for detecting a predetermined condition in the analog input signal, and outputting a control signal; and
an interleave mismatch error adjuster, responsive to the control signal, for suppressing the application of an adjustment signal to at least one of the first or second analog to digital converter cores in response to detection of the predetermined condition.

15. The apparatus of claim 14 wherein the interleave mismatch error adjuster suppresses update of the interleave error estimate.

16. The apparatus of claim 14 additionally comprising:
a memory for storing a stored error estimate corresponding to at least one prior interleave error estimate.

17. The apparatus of claim 16 wherein the interleave mismatch error adjuster further comprises:
using the stored error estimate to provide the adjustment signal in response to detection of the predetermined condition.

18. The apparatus of claim 14 wherein the meter detects signal energy near a predetermined fraction of a sample rate frequency, and the interleave mismatch error adjuster further suppresses updates to at least one of a sample time mismatch error or a gain mismatch error.

19. The apparatus of claim 14 further comprising:
a bandpass filter to detect input signal energy.

20. The apparatus of claim 14 wherein the meter detects low input signal power and the interleave error mismatch adjuster suppresses updates to a gain mismatch error.

21. The apparatus of claim 14 wherein the meter low input signal power and the interleave error mismatch adjuster suppresses updates to more than one mismatch error estimate.

22. The apparatus of claim 14 wherein the meter detects insufficient rate of change over time in the analog input signal, and the interleave error mismatch adjuster suppresses update of a phase correction.

23. The apparatus of claim 14 additionally comprising:
an interleaver, for interleaving the first and second digital signals with a multiplexer to form a digital representation of the input signal.

24. The apparatus of claim 14 wherein the mismatch error is at least one of offset, gain, or sample-time error.

25. The apparatus of claim 14 wherein the analog to digital converter is part of a digital radio frequency signal receiver.

* * * * *